United States Patent [19]
Butler et al.

[11] Patent Number: 5,392,241
[45] Date of Patent: Feb. 21, 1995

[54] SEMICONDUCTOR MEMORY CIRCUIT WITH BLOCK OVERWRITE

[75] Inventors: Edward Butler, Jonesville, Vt.; Ronald A. Sasaki, San Jose, Calif.; Robert Tamlyn, Jericho; Endre P. Thoma, Colchester, both of Vt.

[73] Assignee: International Business Machines Corporation, Armonk, N.Y.

[21] Appl. No.: 165,778

[22] Filed: Dec. 10, 1993

[51] Int. Cl.$^6$ .................................................. G11C 7/00
[52] U.S. Cl. ............................ 365/189.01; 365/189.06
[58] Field of Search ................. 365/189.06, 202, 205, 365/189.01, 900

[56] References Cited

U.S. PATENT DOCUMENTS

| | | | |
|---|---|---|---|
| 4,061,999 | 12/1977 | Proebsting et al. | 365/182 |
| 4,160,275 | 7/1979 | Lee et al. | 365/149 |
| 4,262,342 | 4/1981 | Tuan | 365/203 |
| 4,368,529 | 1/1983 | Furuyama | 365/205 |
| 4,684,942 | 8/1987 | Nishi et al. | 340/703 |
| 4,766,570 | 8/1988 | Yamaguchi et al. | 365/189 |
| 4,876,663 | 10/1989 | McCord | 364/900 |
| 4,893,277 | 1/1990 | Kajigaya et al. | 365/203 |
| 5,083,257 | 1/1992 | Kennedy | 395/131 |
| 5,140,553 | 8/1992 | Choi et al. | 365/201 |
| 5,285,292 | 2/1994 | Matsuki | 365/189.01 X |

OTHER PUBLICATIONS

Charest et al., "Ram Bit Line Isolation," IBM Technical Disclosure Bulletin, vol. 27, No. 4B, pp. 2632-2635, Sep. 1984.

*Primary Examiner*—Do Hyun Yoo
*Attorney, Agent, or Firm*—Heslin & Rothenberg

[57] ABSTRACT

A multimedia dynamic random-access memory (DRAM) or video random-access memory (VRAM) having enhanced block overwrite capabilities includes a plurality of sense amplifiers which are selectively coupled to an array of memory cells via paired bit lines for sensing/writing charge to the memory cells. Each sense amplifier is controlled by a primary set device and a secondary set device. The secondary set device is of smaller size than the primary set device but still sized sufficiently to maintain accessed data appearing on the paired bit lines. Upon decoding of a block overwrite request, the primary set device is momentarily turned off to facilitate forcible overwriting of selected sense amplifiers with new data while the secondary set device maintains data appearing on unselected sense amplifiers. Once block overwrite is complete, the primary set device is reactivated and charge is restored to the memory cells. By momentarily deactivating the primary set device, block overwriting of a large number of bit line pairs is possible.

20 Claims, 5 Drawing Sheets

SEMICONDUCTOR MEMORY CIRCUIT WITH BLOCK OVERWRITE

TECHNICAL FIELD

This invention relates in general to semiconductor memory circuits, and more particularly, to a multimedia dynamic random-access memory (DRAM) or video random-access memory (VRAM) having enhanced block overwrite capabilities.

BACKGROUND OF THE ART

DRAMs are the memory of choice for many computer memory systems. In most DRAMs, single-bit storage elements or cells are arranged in an array fashion. The array is composed of rows and columns, where rows are referred to as "word lines" and columns are referred to as "bit lines". Data lines transfer data to and from the storage arrays. During conventional read and write operations, one memory cell in each column is connected to its corresponding bit line. A sense amplifier attached to each bit line amplifies and restores the signals placed on the bit line during a read operation. In a DRAM chip, read and write operations each require two steps. The first step is to select a row, which is done by asserting a row address strobe (RAS) while the desired row address is on the address inputs. An on-chip row decoder then produces a vector whose bits are zero everywhere except for a one at a selected row. This bit vector determines which row of storage cells is connected to the bit lines and their associated sense amplifiers.

The second step is to select the column, which is done by asserting a column address strobe (CAS) and a read-write signal while the desired column address is on the address inputs. The column address selects a bit from the active row of memory in each array. The selected bits are either buffered for output (during read operations) or set to values received from the data inputs (during write operations).

A VRAM is a particular type of DRAM designed specifically to allow video scanout to be independent of other frame-buffer operations in a video display system. A VRAM chip is similar to a conventional DRAM chip but contains a parallel-in/serial-out data register connected to a second data port. The serial register can be as wide as the memory array and can be parallel loaded by asserting the transfer signal while a row of memory is being read. The serial register has its own data clock, enabling it to transfer data out of the chip at high speeds. The serial register and port effectively provide a second, serial port to the memory array. If this port is used for video scanout, scanout can occur asynchronously to normal reads from and writes to the chip, virtually eliminating any video scanout problem.

One approach to enhancing performance of a DRAM or VRAM is to incorporate a block write feature into the memory circuit. A block write feature allows data to be simultaneously written to a set of bit lines along an accessed word line. In the existing art, a block write function is accomplished by accessing the word lines for a normal read, writing the data to selected bit lines by overpowering the associated sense amplifiers, and then carrying out the normal restore cycle. The problem with the approach is that the write drivers cannot "overpower" more than eight or so active sense amplifiers. Expanding beyond an eight bit line overwrite with this "brute force" approach is technologically not feasible.

The technique described herein is to momentarily turn off the clamping applied to the sense amplifiers in order to block write data onto greater than eight bit line pairs. By turning the sense amplifiers off, the write drivers can block write data onto a significantly larger number of bit lines. The problem with momentarily disconnecting the sense amps, however, is that as the sense amplifiers are floated, data on unselected bit lines may be corrupted. This is because while unaccessed bit lines are left unlatched, voltage loss, etc., is possible.

Thus, the invention described herein allows block overwriting of new data onto a significantly greater number of bit lines, without floating accessed data appearing on unselected bit lines.

DISCLOSURE OF INVENTION

Briefly summarized, the present invention comprises in one aspect a method for block overwriting new data onto selected bit line pairs in an array of memory cells. Overwriting of a large number of bit line pairs is accomplished without floating data values on unselected bit line pairs. The method includes the steps of: identifying a block overwrite request; reducing the strength of a set signal applied to sense amplifiers associated with the bit line pairs such that the clamping strength of the sense amplifiers is reduced; and block overwriting new data onto selected bit lines pairs of the plurality of bit line pairs. By reducing the strength of the set signal prior to block overwriting data onto the selected bit line pairs, block overwriting is facilitated without compromising data appearing on unselected bit line pairs. Again, the clamping strength is reduced but the sense amplifiers are not allowed to float so that data appearing on unselected bit line pairs is maintained.

In a specific embodiment, two separate activation circuits control setting of the sense amplifiers. A primary set device is sized sufficiently to "fast set" or "strongly set" the sense amplifiers, while a secondary set device is sized smaller to "slow set" the sense amplifiers. But the secondary set device is sufficiently sized to maintain data appearing on the sense amplifiers. During a block write operation, the primary set device is deactivated while the secondary set device remains active. This allows the forcible block overwriting of a greater number of sense amplifiers, while data appearing on unselected bit line pairs is forcibly maintained.

In another aspect, a method of operating a memory in a write operational mode is presented. The memory has an array of memory cells activated by respective word lines and sensed by respective bit lines. Each of the word lines is coupled to the bit lines through a set of memory cells. The bit lines are coupled to sense amplifiers and each sense amplifier is controlled by a small set device and a large set device. The method includes: activating a selected one of the word lines to activate one of the sets of memory cells; activating the small set device and the large set device in sequence to sense data stored in the accessed set of memory cells; deactivating the large set device while continuing activation of the small set device; and writing new data to the sense amplifiers of a selected subset of the accessed set of memory cells. After block writing of new data, the large set device is reactivated and data is restored to the set of memory cells.

In still another aspect, the invention comprises a semiconductor memory circuit which includes an array of memory cells for storing charge. The array of memory cells includes a plurality of paired bit lines each of which is coupled to a sense amplifier for sensing/writing charge to the memory cell. A primary set device, which is coupled to each sense amplifier, allows clamping of data appearing on the plurality of paired bit lines. A secondary set device is also coupled to each sense amplifier and functions to maintain data appearing on the paired bit lines in the absence of data clamping by the primary set device. Also provided are control means for momentarily removing data clamping by the primary set device during a block overwrite of new data onto at least two selected paired bit lines of the plurality of paired bit lines such that block overwriting of selected bit line pairs is facilitated, while data appearing on unselected paired bit lines is forcibly maintained.

Block overwriting in accordance with the invention allows a significantly greater number of bit lines to be overwritten with new data in a single block overwrite cycle compared with pre-existing approaches. The novel block overwrite technique is applicable to multimedia dynamic random-access memory or multimedia video random-access memory. Block overwrite enhancement is attained without reliance on larger write drivers/bit switches, isolatable sense amplifiers or multiple data line sets. In practice, block overwriting of any number greater than eight bit line pairs is possible, including up to and beyond 256 bit line pairs.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Figure 1:
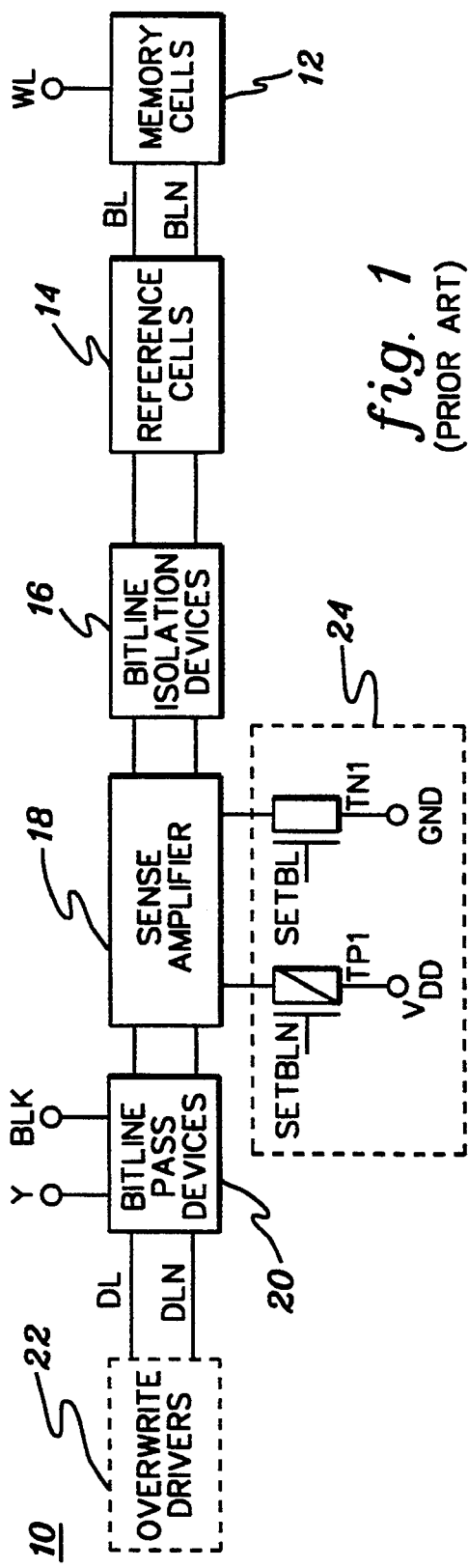
FIG. 1 is a partial block diagram of a paired bit line of a conventional semiconductor memory circuit.
Figure 4:
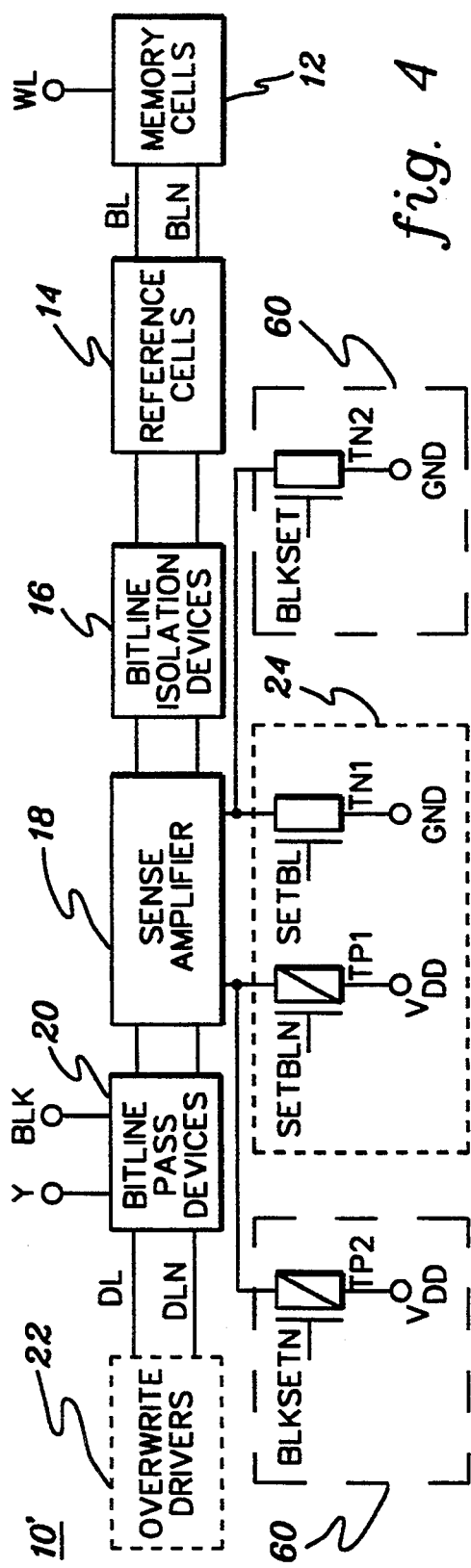
FIG. 4 is a partial block diagram of a paired bit line of a semiconductor memory circuit employing block overwriting in accordance with the invention.

Refer now to the drawings wherein the same reference numbers are used throughout multiple figures to designate the same or similar components. In FIGS. 1 & 4, complementary metal oxide semiconductor (CMOS) circuits with P-channel field-effect transistors (PFETs) are indicated by a rectangle with a diagonal line formed therein and a control element or gate electrode arranged adjacent thereto, and N-channel field-effect transistors (NFETs) are indicated by a rectangle without a diagonal line and with a control element or gate electrode arranged adjacent thereto.

FIG. 1 depicts a partial, conventional semiconductor memory circuit, generally denoted 10, having paired bit lines 'BL' & 'BLN'. The signal on bit line 'BLN' is the complement of the signal on bit line 'BL'. The paired bit lines connect memory cells 12, reference cells 14, bit line isolation devices 16, sense amplifier 18 and bit line pass devices 20 as shown. In actual implementation the paired bit line of FIG. 1 is repeated, for example, 256, 512, etc. times, throughout the semiconductor memory circuit in a well known manner. Individual memory cells 12 are selected by a word line select signal 'WL'. This signal is generated by the memory circuit using a decoded row address received from an external controller (not shown).

In a write cycle, bit line overwrite drivers 22 provide data signals 'DL' and 'DLN' to the true bit line 'BL' and complement bit line 'BLN', respectively. A pair of set devices 24 clamp and amplify, through sense amplifier 18, accessed data appearing on the paired bit lines. This occurs subsequent to a bit line data development interval within a given access cycle.

Sense amplifier 18 comprises a CMOS latch which includes a P latch circuit, controlled by a PFET set device TP1, and an N latch circuit, controlled by an NFET set device TN1. Set devices TP1 and TN1 comprise paired set devices 24. The sense amplifiers associated with the bit line pairs of the memory array are typically connected to a single large PFET TP1 and a single large NFET TN1 for the latching of data on lines 'BL' and 'BLN' subsequent to signal development.

Figure 2:
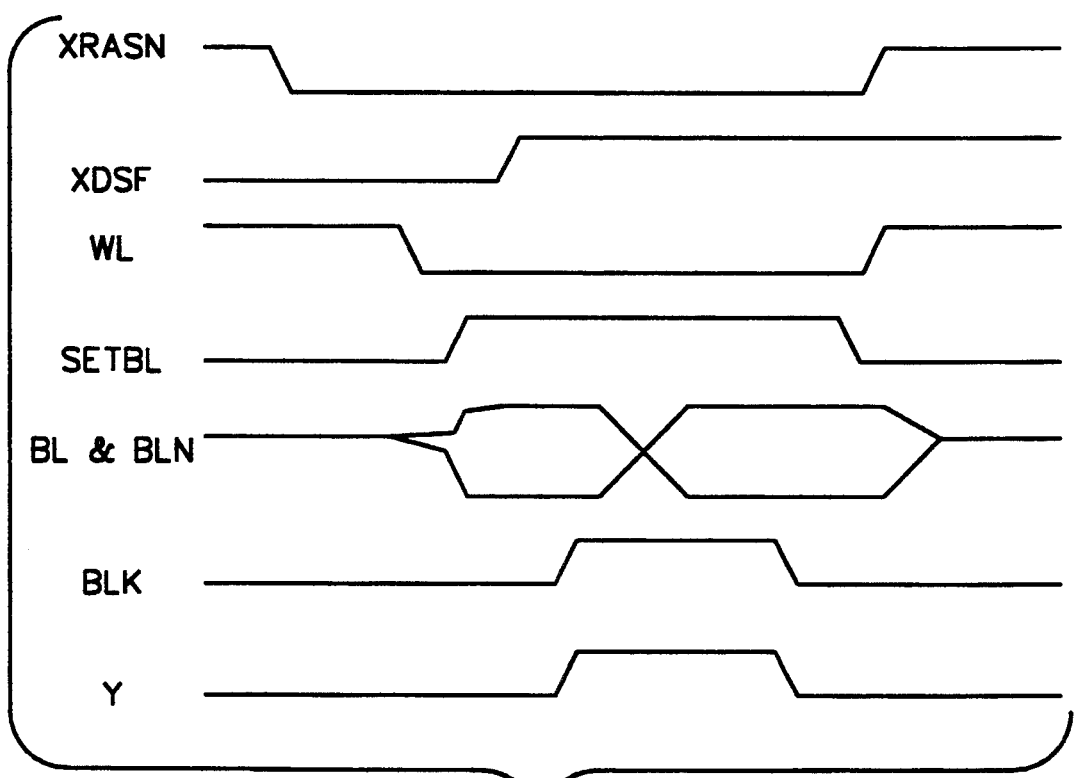
FIG. 2 is a timing diagram useful in explaining conventional block overwriting using the semiconductor memory circuit of FIG. 1.

Although not shown, certain memory circuits may include a supplemental pairing of set devices comprising a small PFET and a small NFET which allow staged activation of the sense amplifier subsequent to data development on the associated paired bit lines. Such a staged activation is depicted in FIG. 2 (discussed below) wherein the data values on the bit line 'BL' and complementary bit line 'BLN' are initially slowly sensed and then strongly or quickly clamped upon activation of the large PFET and large NFET set devices. Staged activation of sense amplifiers is often employed to prevent the sense amplifiers from latching so quickly that incorrect data is clamped.

When requested by an external controller, the memory circuit activates the bit line pass devices 20, via control signals 'Y' and 'BLK', to allow overwriting of latched data by overwrite drivers 22, (i.e., respective overwriting of latched data with data signal 'DL' and signal 'DLN'). Conventionally, set devices 24 are sized to comprise powerful high performance devices that minimize the time required to perform a DRAM/VRAM read operation, while overwrite drivers 22 are size optimized to overwrite one sense amplifier 18 (i.e., one bit of information) during a DRAM/VRAM write operation.

In the existing art, a block write function can only be accomplished with up to eight sense amplifiers being overwritten in a single block write cycle. This significant limitation results from the strong clamping by set devices 24 of data on the paired bit lines, which is desirable to perform a read operation. Obviously, to the extent that the number of sense amplifiers subject to a single "brute force" overwrite can be increased, performance is enhanced.

A timing diagram for a conventional block write operation is shown in FIG. 2. In this diagram, the block write is assumed to occur after the complement, external row address strobe signal (XRASN) falls, a normal word line 'WL' (and associated reference word lines (not shown)) is selected, data has developed on the paired bit lines 'BL' and 'BLN', and the sense amplifiers have been set with a Set Bit Line pulse (SETBL). When an external Designated Special Function signal (XDSF) from the memory controller goes high, a block write operation is defined. True data 'DL' is presented on line 'BL' and complementary data 'DLN' is driven to line 'BLN', and the associated pass devices 20 are activated by decoded control signals 'Y' and 'BLK'.

In the timing diagram of FIG. 2, the latched data signals in sense amplifier 18 from lines 'BL' and 'BLN' are assumed to be overwritten by opposite data signals received from drivers 22, thereby resulting in the illustrated signal switch. After the cells have been overwritten, signal XRASN returns high and a normal cell restore phase begins. Because of the large size of the set devices 24 block writing of greater than eight bit line pairs cannot be accomplished in one block write cycle with a driven data line polarity.

Figure 3:
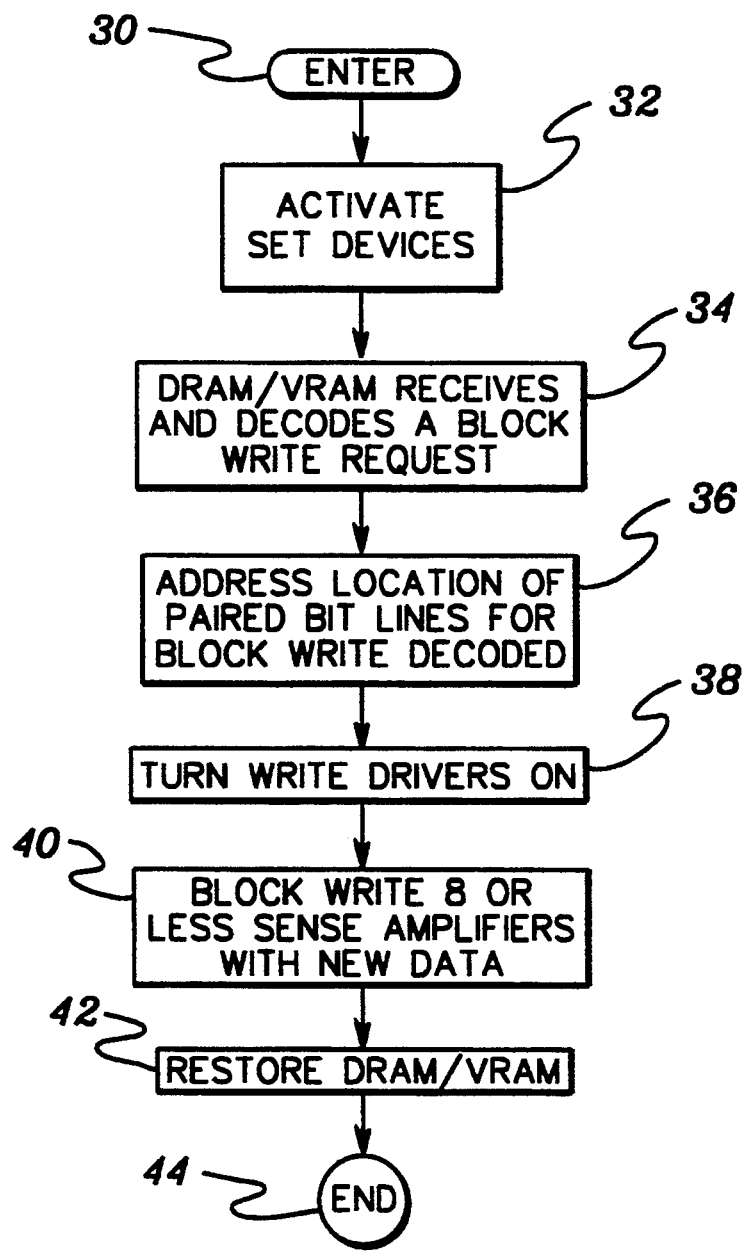
FIG. 3 is a flowchart of one embodiment of conventional block overwrite processing.

FIG. 3 is an overview of existing block write processing. Processing begins, 30 "Enter," with activation of the set devices 24 (FIG. 2) during a normal cell access cycle, 32 "Activate Set Devices." A block overwrite request is received and decoded, 34 "DRAM/VRAM Receives And Decodes A Block Write Request," after which the location of the paired bit lines to be overwritten is obtained, 36 "Address Location Of Paired Bit Lines For Block Write Decoded." The external controller dictates when a block overwrite is to occur through external control signals, such as signals XRASN and XDSF (FIG. 2). These signals are fed from the memory controller to the memory circuit and decoded on chip by control logic within the memory circuit.

Substantially simultaneous with decoding of a block write request, address location information is transferred from the external controller to the memory circuit and decoded in a row/column address decoder (not shown). In the existing embodiment, the address information can identify for a block overwrite up to eight sequential bit line pairs from, for example, 512 paired bit lines in a 4 Meg design. The overwrite drivers are turned on, 38 "Turn Write Drivers On," and a block overwrite of the sense amplifiers using overwrite data 'DL' and 'DLN' is performed, 40 "Block Write 8 Or Less Sense Amplifiers With New Data." Once block written, the bit line pairs are restored, 42 "Restore DRAM/VRAM," to await the next access cycle, thus completing the overwrite function, 44 "End."

Next is described a novel block overwrite control process and circuit which significantly relieves the performance limitations of this conventional "brute force" overwriting approach.

In FIG. 4, a semiconductor memory circuit, denoted 10', is shown which is similar to circuit 10 of FIG. 1. In FIG. 4, however, the set devices 24 are relabeled a primary set device, and a secondary set device 60 is added. Further, the control signal Set Bit Line (SETBL) and its complement signal (SETBLN) provided to NFET TN1 and PFET TP1, respectively, are modified as described below.

Semiconductor memory circuit 10' is similar to some existing memory circuits wherein multiple pairs of set devices are employed in sequence to clamp data. However, the purpose and operation of these particular paired set devices are completely different. Specifically, as introduced above certain memory circuits employ a "slow responding" pair of set devices in combination with a "fast responding" pair of set devices in order to stage setting of the CMOS latch within sense amplifier 18. This is done to avoid an incorrect setting of the sense amplifier and to reduce unwanted conduction in the sense amplifier subsequent to a bit line signal development interval which can result from too fast setting of the CMOS latch. With such a structure, however the on-chip logic providing the control signals to the pairs of set devices is different from that providing the control signals to primary set device 24 and secondary set device 60 of FIG. 4 to accomplish block overwriting pursuant to this invention. If desired, however, the present invention can be combined with sequenced clamping of data appearing on the paired bit lines.

Figure 5:
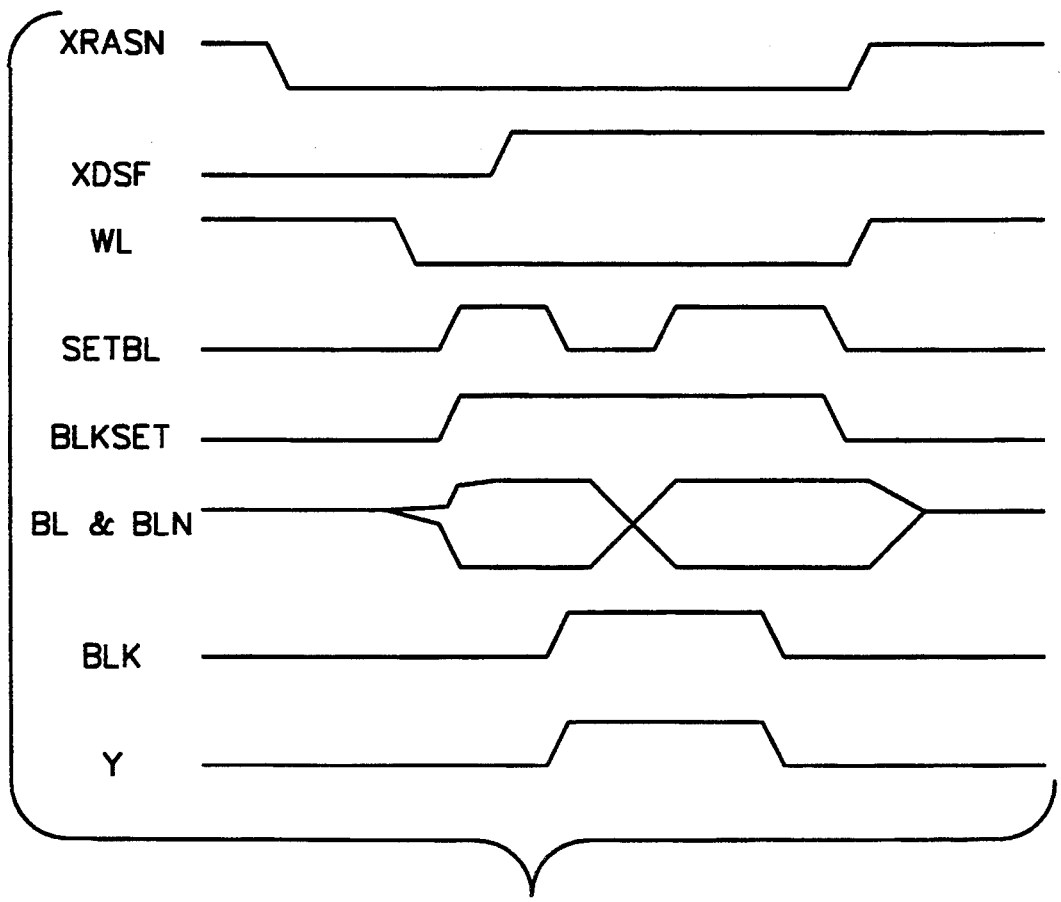
FIG. 5 is a timing diagram useful in explaining (with reference to FIG. 4) block overwriting in accordance with the invention.

As shown best by the timing diagram of FIG. 5, a block overwrite function is expanded in accordance with the invention by temporarily deactivating the primary set device from clamping data at the sense amplifiers of the memory circuit. This allows block overwriting to proceed in the absence of the strong clamping provided by the primary set device. The assumption in this discussion is that the secondary set device is smaller than the primary set device, but still of sufficient size to maintain the data developed on the paired bit lines. By selective momentary reduction of clamping strength applied to the sense amplifiers, memory circuit 10' is able to maintain the performance criteria for a single bit read/write operation, while simultaneously providing significantly enhanced block overwrite capabilities. Further, data integrity of unselected sense amplifiers is maintained under control of the secondary set device.

Sizing of secondary set device 60 can be readily determined by one of ordinary skill in the art. Criteria to be considered include:

1. The number of sense amplifiers (and thus bit line pairs) desired to be block overwritten;
2. The overwrite drivers' capabilities;
3. The minimum size requirement to maintain data integrity in unselected sense amplifiers; and
4. Any other unique attributes of the architecture within which the block overwrite process is implemented.

As an example, one primary set device to secondary set device size ratio might be 10:1. As used herein, "size" refers to the channel width/channel length ratio of the transistors comprising the two different pairs of set devices. Further, the "strength" of a set signal applied to a sense amplifier is directly proportional to the current sinking capability of the sense amplifier. Specifically, a strong set signal results in a sense amplifier with greater current sinking capabilities than a weak set signal.

Note from the block overwrite timing diagram of FIG. 5 that processing in accordance with the invention employs a new control signal, referred to as the Block Set signal (BLKSET), and that the SETBL signal is modified to provide the momentary deactivation of the primary set device. Although not shown in the timing diagram, the complementary signals (BLKSETN and SETBLN) are also provided. Again, the transition in signals 'BL' and 'BLN' is assumed to occur because a new data type is forcibly written into the sense amplifier during the block write. The remaining signals are similar to those discussed above.

Figure 6:
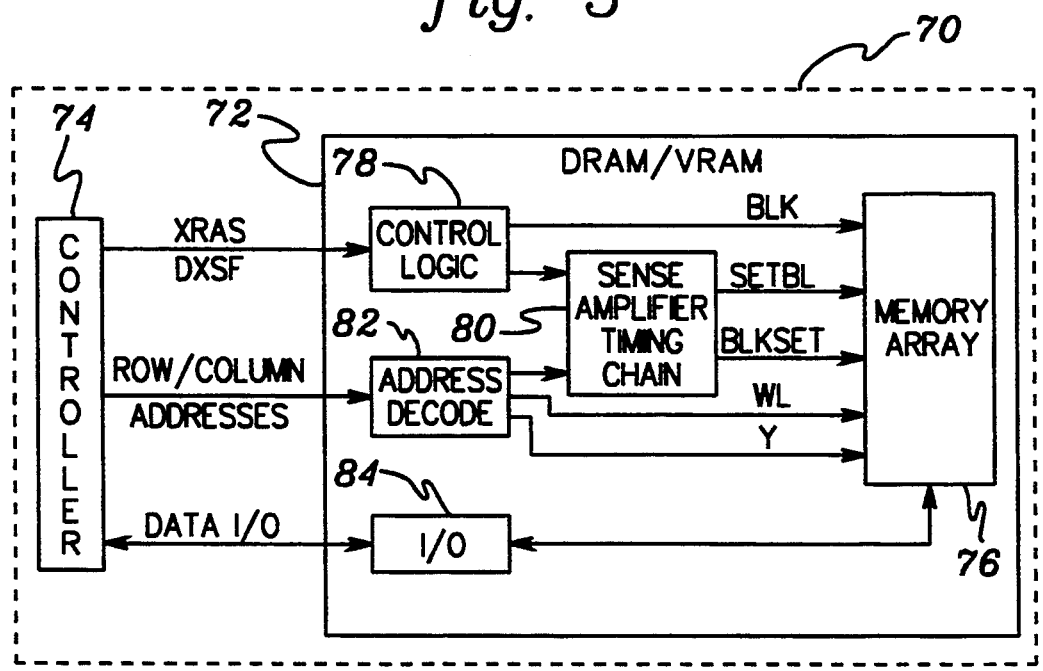
FIG. 6 is a partial block diagram of a data processing system employing a DRAM/VRAM having block overwrite capabilities in accordance with the invention.

A high level diagram of a data processing system 70 having a DRAM/VRAM circuit 72 in accordance with the invention is presented in FIG. 6. As shown, semiconductor memory circuit 72 is coupled to a memory controller 74. Controller 74 provides control signals, such as XRAS & XDSF, to a control logic 78 within circuit 72. Logic 78 produces timing signals for a memory array 76 and a sense amplifier timing chain 80. For example, bit line switching signal 'BLK' is fed directly from control logic 78 to the bit switches of the various bit line pairs (see FIG. 4).

Sense amplifier timing chain 80 also receives input from an address decode circuit 82, which itself is controlled by row/column addresses received from controller 74. Timing chain 80 outputs the SETBL and BLKSET signals, along with their complements, to the primary and secondary set devices of memory array 76. One of ordinary skill of in the art can readily implement a timing chain to provide these signals, which are depicted and described herein. Also output from address decoder 82 are word line address signal 'WL' and write switching signal 'Y'. An I/O interface 84 receives/transmits data between memory circuit 72 and controller 74, and is coupled to memory array 76.

Figure 7:
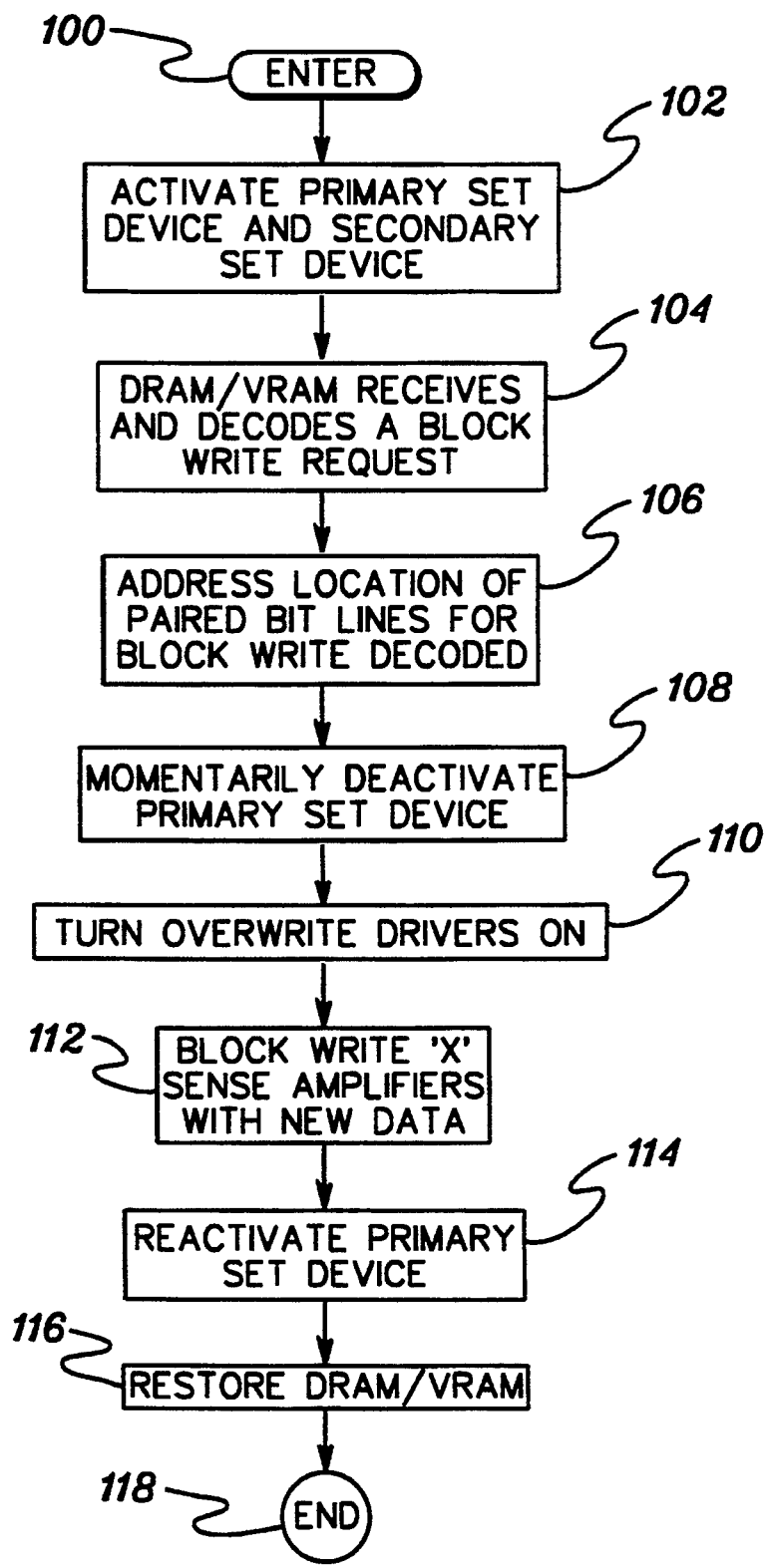
FIG. 7 is a flowchart of one embodiment of block overwrite processing in accordance with the invention.

One embodiment of block overwrite processing in accordance with the invention is depicted in FIG. 7. Initially, 100 "Enter," the primary set device and secondary set device are activated, 102 "Activate Primary Set Device and Secondary Set Device," which is the normal processing of a cell access cycle. Upon receipt of a block overwrite command, 104 "DRAM/VRAM Receives And Decodes A Block Write Request," an address location of the bit lines to be overwritten is obtained, 106 "Address Location Of Paired Bit Lines For Block Write Decoded." The primary set device is then momentarily deactivated, 108 "Momentarily Deactivate Primary Set Device," and the overwrite drivers are initiated to provide the new data on data lines 'DL' and 'DLN' to the addressed bit lines to overwrite the associated sense amplifiers, 110 "Turn Write Drivers On," and 112 "Block Write 'X' Sense Amplifiers With New Data." As used herein, the variable 'X' can comprise any number, such as any number greater than eight (e.g., 256). Once the new data has been written, the primary set devices are reactivated, 114 "Reactivate Primary Set Devices," and the DRAM/VRAM state is restored to await the next access cycle, 116 "Restore DRAM/VRAM." Block overwriting is then complete, 118 "End."

Block overwriting in accordance with the invention allows a significantly greater number of bit lines to be overwritten with new data in a single block overwrite cycle than pre-existing approaches. The novel block overwrite technique is applicable to multimedia dynamic random-access memory or multimedia video random-access memory. Block overwrite enhancement is attained without reliance on larger write drivers/bit switches, isolatable sense amplifiers or multiple data line sets. In practice, block overwriting of any number greater than eight bit line pairs is possible, including up to and beyond 256 bit line pairs.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A method for block overwriting data onto at least two selected bit line pairs of a plurality of bit line pairs in an array of memory cells while maintaining data appearing on unselected bit line pairs of the plurality of bit line pairs, each bit line pair having an associated sense amplifier for clamping data appearing thereon, each sense amplifier being controlled by a set signal having a strength which dictates how strongly data is clamped by the sense amplifier, said block overwriting method comprising the steps of:

(a) decoding a block overwrite request;
   (b) reducing the strength of the set signal applied to the sense amplifiers without floating the sense amplifiers such that data appearing thereon are maintained; and
   (c) block overwriting data onto at least two selected bit line pairs of the plurality of bit line pairs, whereby reducing the strength of the set signal prior to block overwriting of data onto selected bit line pairs facilitates the block overwriting without compromising data appearing on unselected bit line pairs.

2. The block overwriting method of claim 1, further comprising the step of increasing the strength of the set signal after said block overwriting of step (c).

3. The block overwriting method of claim 2, further comprising the step of restoring data appearing on the plurality of bit line pairs in the array of memory cells subsequent to said increasing of the strength of the set signal.

4. The block overwriting method of claim 1, wherein the at least two selected bit line pairs undergoing the block overwriting of step (c) comprise greater than eight selected bit line pairs, and wherein said block overwriting of greater than eight bit line pairs of step (c) occurs within a single block overwrite cycle.

5. A method for block overwriting data onto at least two selected bit line pairs of a plurality of bit line pairs in an array of memory cells while maintaining data appearing on unselected bit line pairs of the plurality of bit line pairs, each bit line pair having an associated sense amplifier, each sense amplifier being connected to a primary set device and a secondary set device for clamping and maintaining, respectively, data appearing on the associated bit line pair, said block overwriting method comprising the steps of:

(a) activating the primary set device and the secondary set device subsequent to development of accessed data on the plurality of bit line pairs in the array of memory cells;
   (b) deactivating the primary set device to remove data clamping of the plurality of the bit line pairs, while continuing activation of the secondary set device such that accessed data continues to be maintained on the plurality of bit line pairs;
   (c) block overwriting new data onto selected bit line pairs of the plurality of bit line pairs; and
   (d) reactivating the primary set device upon completion of said block overwriting of step (c).

6. The block overwriting method of claim 5, further comprising the step of restoring data appearing on the plurality of bit line pairs in the array of memory cells subsequent to said reactivating step (d).

7. The block overwriting method of claim 5, wherein said activating step (a) includes activating said secondary set device prior to activating said primary set device such that a staged clamping of accessed data occurs on the plurality of bit line pairs in the array of memory cells.

8. The block overwriting method of claim 5, further comprising the step of decoding a block write request prior to said deactivating step (b).

9. The block overwriting method of claim 8, further comprising the step of decoding address locations of selected bit line pairs of the plurality of bit line pairs for block overwriting of new data in said step (c).

10. A method for operating a memory in a write operational mode, the memory having an array of memory cells activated by respective word lines and sensed by respective bit lines, each of the word lines being coupled to the bit lines through a set of the memory cells, the bit lines being coupled to sense amplifiers, each sense amplifier having a small set device and a large set device, said operating method comprising the steps of:
(a) activating a selected one of the word lines to activate one of the sets of memory cells;
(b) activating the small set device and the large set device in sequence to sense data stored in the accessed set of memory cells;
(c) deactivating the large set device while continuing activation of the small set device; and
(d) writing new data to the sense amplifiers of a selected subset of the accessed set of memory cells.

11. The operating method of claim 10, further comprising the steps of reactivating the large set device and restoring data to the accessed set of memory cells.

12. The operating method of claim 10, wherein said writing of step (d) includes forceably overwriting the sense amplifiers coupled to the selected subset of memory cells.

13. A semiconductor memory circuit comprising:
an array of memory cells for storing charge therein, said array of memory cells including a plurality of paired bit lines;
a plurality of sense amplifiers selectively coupled to said memory cells via said plurality of paired bit lines for sensing/writing charge to said memory cells, each sense amplifier being coupled to a corresponding paired bit line of the plurality of paired bit lines;
a primary set device coupled to each sense amplifier of said plurality of sense amplifiers, said primary set device including means for clamping data appearing on the plurality of paired bit lines;
a secondary set device coupled to each sense amplifier of said plurality of sense amplifiers, said secondary set device including means for maintaining data appearing on the plurality of paired bit lines in the absence of data clamping by the primary set device; and
control means for momentarily removing data clamping by the primary set device during a block overwrite of new data onto at least two selected paired bit lines of the plurality of paired bit lines such that block overwriting of the at least two selected bit line pairs is facilitated while data appearing on unselected paired bit lines is maintained by the secondary set device.

14. The semiconductor memory circuit of claim 13, further comprising means for block overwriting of the new data onto the at least two selected paired bit lines of the plurality of paired bit lines.

15. The semiconductor memory circuit of claim 13, wherein the primary set device comprises a first PFET and a first NFET, the secondary set device comprises a second PFET and a second NFET, and wherein the first PFET is sized larger than the second PFET and wherein the first NFET is sized larger than the second NFET.

16. The semiconductor memory circuit of claim 15, wherein the first PFET and the second PFET have a size ratio of approximately 10:1, and wherein the first NFET and the second NFET have a size ratio of approximately 10:1.

17. The semiconductor memory circuit of claim 13, wherein said control means includes control logic and a sense amplifier timing chain coupled thereto, said control logic and sense amplifier timing chain including means for providing control signals to the primary set device and the secondary set device for momentarily removing data clamping of the primary set device during a block overwrite of new data onto the at least two selected paired bit lines of the plurality of paired bit lines.

18. The semiconductor memory circuit of claim 13, wherein said memory circuit comprises either a DRAM or a VRAM structure.

19. The semiconductor memory circuit of claim 18, in combination with a memory controller coupled to the semiconductor memory circuit, said memory controller including means for providing the semiconductor memory circuit with addressing signals which identify the at least two selected paired bit lines of the plurality of paired bit lines to be block overwritten.

20. A method for latching sensed data on a plurality of bit line pairs in an array of memory cells during a data access cycle, each bit line pair having an associated sense amplifier for clamping data appearing thereon, each sense amplifier being responsive to a first set signal and to a second set signal, said data latching method comprising the steps of:
(a) applying the first set signal and the second set signal in sequence to the sense amplifiers subsequent to development of sensed data on the plurality of bit line pairs in the array of memory cells such that sensed data is latched in the associated sense amplifiers; and
(b) removing for a portion of the data access cycle of one of the first set signal and the second set signal from the sense amplifiers, while continuing to apply the other of the first set signal and the second set signal to the sense amplifiers.

* * * * *